(12) United States Patent  
Gupta et al.

(10) Patent No.: US 10,177,773 B2  
(45) Date of Patent: Jan. 8, 2019

(54) PROGRAMMABLE CLOCK DIVIDER

(71) Applicant: STMicroelectronics International N.V., Amsterdam (NL)

(72) Inventors: Nitin Gupta, Kurukshetra (IN); Jeet Narayan Tiwari, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 267 days.

(21) Appl. No.: 15/297,537

(22) Filed: Oct. 19, 2016

(65) Prior Publication Data

US 2018/0109266 A1 Apr. 19, 2018

(51) Int. Cl.
| | |
|---|---|
| *H03K 21/00* | (2006.01) |
| *H03K 23/00* | (2006.01) |
| *H03L 7/197* | (2006.01) |
| *H03K 19/20* | (2006.01) |
| *H03K 21/10* | (2006.01) |
| *H03K 23/70* | (2006.01) |
| *H03K 23/66* | (2006.01) |
| *H03K 23/68* | (2006.01) |

(52) U.S. Cl.
CPC ........... *H03L 7/1974* (2013.01); *H03K 19/20* (2013.01); *H03K 21/00* (2013.01); *H03K 21/10* (2013.01); *H03K 23/00* (2013.01); *H03K 23/667* (2013.01); *H03K 23/68* (2013.01); *H03K 23/70* (2013.01)

(58) Field of Classification Search
None
See application file for complete search history.

(56) References Cited

U.S. PATENT DOCUMENTS

| | | |
|---|---|---|
| 4,366,394 A | 12/1982 | Clendening et al. |
| 4,953,187 A | 8/1990 | Herold et al. |
| 4,991,187 A * | 2/1991 | Herold ................. H03K 23/667 377/44 |
| 5,341,031 A | 8/1994 | Kinoshita et al. |
| 5,359,232 A | 10/1994 | Eitrheim et al. |

(Continued)

OTHER PUBLICATIONS

Cong, H-I, et al., "Multigigahertz CMOS Dual-Modulus Prescalar IC," IEEE Journal of Solid-State Circuits, vol. 23, No. 5, Oct. 1998, 6 pages.

(Continued)

*Primary Examiner* — Tuan T Lam  
(74) *Attorney, Agent, or Firm* — Slater Matsil, LLP (57) ABSTRACT

In accordance with an embodiment, a circuit includes an input clock terminal, an output clock terminal, a first input data terminal, and a set of input data terminals having a number of terminals. A divide-by-two block is coupled to the output clock terminal. A modular one-shot clock divider is coupled between the input clock terminal and the divide-by-two block. The modular one-shot clock divider is further coupled to the set of input data terminals. An intermediate clock generation block is coupled between the input clock terminal and the modular one-shot clock divider. The intermediate clock generation block includes a first digital logic block coupled between the input clock terminal and the modular one-shot clock divider. The first digital logic block is further coupled to the first input data terminal, and a clock-blocking block is coupled between the divide-by-two block and the first digital logic block.

21 Claims, 8 Drawing Sheets

(56) References Cited

U.S. PATENT DOCUMENTS

| | | |
|---|---|---|
| 5,459,855 A | 10/1995 | Lelm |
| 5,859,890 A | 1/1999 | Shurboff et al. |
| 5,878,101 A | 3/1999 | Aisaka |
| 5,914,996 A | 6/1999 | Huang |
| 6,009,139 A | 12/1999 | Austin et al. |
| 6,061,418 A | 5/2000 | Hassoun |
| 6,157,693 A | 12/2000 | Jayaraman |
| 6,242,953 B1 | 6/2001 | Thomas |
| 6,333,959 B1 | 12/2001 | Lai et al. |
| 6,542,013 B1 | 4/2003 | Volk et al. |
| 6,566,918 B1 | 5/2003 | Nguyen |
| 6,600,355 B1 | 7/2003 | Ngyuen |
| 6,608,513 B2 | 8/2003 | Tschanz et al. |
| 6,744,289 B2 | 6/2004 | Nguyen et al. |
| 6,882,196 B2 | 4/2005 | Yee et al. |
| 7,042,257 B2 | 5/2006 | Wang |
| 7,233,181 B2 | 6/2007 | Osako |
| 7,417,474 B1 * | 8/2008 | Jamal .................... H03K 23/68 327/117 |
| 7,587,019 B2 | 9/2009 | Yu et al. |
| 7,719,326 B2 | 5/2010 | Casagrande et al. |
| 8,466,720 B2 | 6/2013 | Gupta |
| 2004/0252804 A1 | 12/2004 | Aoyama |
| 2007/0152720 A1 * | 7/2007 | Koh ..................... H03K 23/425 327/115 |
| 2009/0322386 A1 * | 12/2009 | Wu ..................... H03K 23/667 327/117 |
| 2012/0161823 A1 * | 6/2012 | Gupta .................. H03K 21/023 327/115 |
| 2014/0253188 A1 * | 9/2014 | Choi ..................... H03K 23/42 327/115 |
| 2015/0010124 A1 * | 1/2015 | Gupta ................... H03K 23/40 377/118 |
| 2016/0315621 A1 * | 10/2016 | Tiwari ................ H03K 21/026 |

OTHER PUBLICATIONS

Larsson, P., "High-Speed Architecture for a Programmable Frequency Divider and a Dual-Modulus Prescaler," Journal: JSSC, vol. 31, No. 5, May 1996, 5 pages.

* cited by examiner

PROGRAMMABLE CLOCK DIVIDER

TECHNICAL FIELD

The present disclosure relates generally to an electronic device, and more particularly to a programmable clock divider.

BACKGROUND

Electronic devices are pervasive in many applications from computers to automobiles. Many of the digital circuits in electronic devices operate with a clock signal. The clocking needs of particular circuits inside a system may be different to each other for a variety of reasons. For example, a slower clock may be desired for a particular sub-block to reduce power consumption. A common technique typically used to provide appropriate clocking to each circuit in a system is to generate sub-clocks from a first clock, where the sub-clocks may have a different clocking frequency than the first clock.

A common technique used to generate a slow clock from a fast clock is by using a prescaler circuit. A prescaler circuit, also known as a clock divider, is an electronic circuit configured to receive an input clock and generate an output clock with a lower frequency than the input clock. For example, the output clock may have a frequency that is four times slower than the frequency of the input clock. Such divided clock may serve as an input for other sub-blocks, such as counters, computational elements and other digital circuits, phase locked loop (PLL), and other circuits known in the art.

A programmable clock divider is a clock divider that may divide an input clock by a programmable integer number. The integer number may be programmed dynamically by using registers, digital signals, digital communications or any other way known in the art.

SUMMARY

In accordance with an embodiment, a circuit includes an input clock terminal; an output clock terminal; a first input data terminal; a set of input data terminals having a number of terminals; a divide-by-two block coupled to the output clock terminal; a modular one-shot clock divider coupled between the input clock terminal and the divide-by-two block, the modular one-shot clock divider further coupled to the set of input data terminals; and an intermediate clock generation block coupled between the input clock terminal and the modular one-shot clock divider, the intermediate clock generation block including a first digital logic block coupled between the input clock terminal and the modular one-shot clock divider, the first digital logic block further coupled to the first input data terminal, and a clock-blocking block coupled between the divide-by-two block and the first digital logic block.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a high speed programmable clock divider with near fifty percent duty cycle in various configurations. Embodiments of the present invention may also be implemented in other configurations and with other digital techniques known in the art.

In an embodiment of the present invention, a programmable clock divider is configured to generate an output clock based on dividing an input clock by a programmable integer number that may have n bits. The programmable clock divider may be implemented with two main sub-blocks: a modular one-shot divider may receive a first configuration word including the n-i most-significant bits (MSBs) of the programmable integer number and may divide an intermediate clock by the decimal equivalent of the first configuration word; and an intermediate clock generator block configured to generate the intermediate clock based on the input clock. The intermediate clock generator block may pulse or not pulse each time the input clock pulses based on the status of the least-significant bit (LSB) of the programmable integer number. An additional divide-by-two block may be included to generate an output clock that may have near 50% duty cycle.

A programmable clock divider may be used as a clock generator for circuits such as PLL circuits and digital frequency synthesizer. Such circuits may be sensitive to the frequency and duty cycle of their respective input clock. The frequency and duty cycle of the generated clock, therefore, may affect the performance of circuits depending on such generated clock. For example, a circuit, such as a particular PLL, may ignore pulses shorter than a particular period, such as 2 ns. Therefore, a clock divider receiving an input frequency of, for example, 5 GHz, and generating a frequency of, for example, 1 GHz with a duty cycle of less than 20% may not be suitable for such PLL.

Programmable clock dividers have been implemented in the past. An approach that has been used to generate a high speed programmable clock divider with near 50% output duty cycle is described in Patent Publication No. 2012/0161823, which is hereby incorporated by reference.

In some embodiments of the present invention, a modular one-shot divider is configured to generate a one-shut pulse every x number of intermediate clock pulses, where x number is the decimal equivalent of n-1 MSBs of a programmable integer number having n bits. The one-shut pulse may be used to toggle a divide-by-two block which may generate a near 50% duty cycle output clock. An intermediate clock generator block may be used to generate the intermediate clock based on the input clock. The intermediate clock generator block may include a clock-blocking block that may either block or not block the input clock based on the LSB of the programmable integer number.

Figure 1:
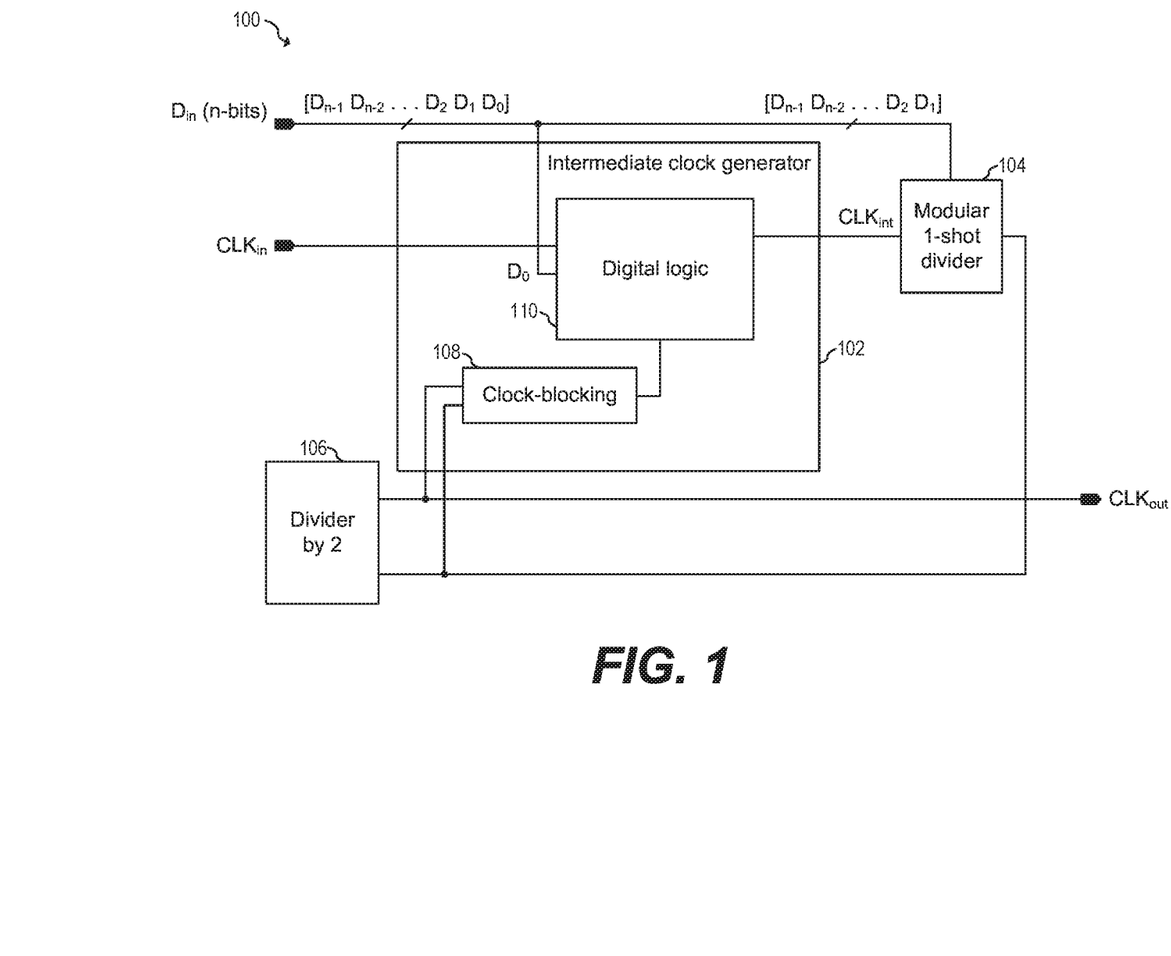
FIG. 1 shows a programmable clock divider 100 according to an embodiment of the present invention.

FIG. 1 shows programmable clock divider 100 according to an embodiment of the present invention. Programmable clock divider 100 is configured to receive input clock $CLK_{in}$ and generate output clock $CLK_{out}$. Output clock $CLK_{out}$ may operate at a frequency resulting from dividing a frequency of input clock $CLK_{in}$ by the decimal equivalent of data input $D_{in}$, which may be an integer number. Programmable clock divider 100 includes Modular one-shot divider 104, divide-by-two block 106 and intermediate-clock-generator block 102.

During normal operation, input clock $CLK_{in}$ may be operating at a frequency that may be in the range between 1 GHz and 10 GHz, and may be, for example, 5 GHz. The input clock operating frequency may be lower than 1 GHz, and may be 1 MHz, or lower. For example, for static logic may run at a frequency of 1 Hz or lower. The input clock operating may be higher than 10 GHz, and the limit may depend on the particular process technology and supply voltage selected. Output clock $CLK_{out}$ may be generated to operate at a frequency resulting from dividing the input frequency by data input $D_{in}$, which may be an n-bit integer, where n may be a number greater or equal to 2. Modular one-shot divider 104 is configured to receive intermediate clock $CLK_{int}$ and to produce an output clock based on intermediate clock $CLK_{int}$. Modular one-shot divider 104 may be configured to divide intermediate clock $CLK_{int}$ by the n-1 MSBs of data input $D_{in}$ and to produce on its output such divided clock. For example, modular one-shot divider 104 may receive may generate a one-shot pulse every x number of intermediate clock $CLK_{int}$ pulses, where x is the decimal equivalent of the n-1 MSBs of data input $D_{in}$. Divide-by-two block 106 may toggle each time modular one-shot divider pulses, thereby further dividing the frequency generated by modular one-shot divider 104 by two and generating output clock $CLK_{out}$ having a duty cycle of near 50%.

Intermediate clock generator block 102 may be configured to generate intermediate clock $CLK_{int}$ based on input clock $CLK_{in}$. Intermediate clock generator block 102 may include digital logic block no and clock-blocking block 108. Digital logic block no may be configured by $D_o$, which may be the LSB of input data $D_{in}$, and by an output generated by clock-blocking block 108. Clock-blocking block 108 may generate an output based on the state of the output of modular one-shot divider 104 and output clock $CLK_{out}$.

When $D_o$ is zero, the output of clock-blocking block 108 is ignored and intermediate clock $CLK_{int}$ pulses each time input clock $CLK_{in}$ pulses. Divide-by-two block 106 further divides the clock by two, generating output clock $CLK_{out}$ having 50% duty cycle. For example, if data input $D_{in}$ is a 4-bit number such as binary value 1000, the 3-bit MSB 100 configures modular one-shot divider 104 to divide intermediate clock $CLK_{int}$ by 4. Since $D_o$ is zero, intermediate clock $CLK_{int}$ may be identical to input clock $CLK_{in}$. Modular one-shot divider 104, therefore, produces a pulse for every 4 pulses of input clock $CLK_{in}$. Divide-by-two block 106 toggles each time modular one-shot divider pulses, resulting in output clock $CLK_{out\ being}$ 4 cycles in a first state, such as high, and 4 cycles in a second state, such as low. The resulting frequency of output clock $CLK_{out}$ is 8 times slower than input clock $CLK_{in}$, thus, dividing input clock $CLK_{in}$ by 8, or its binary equivalent 1000. The resulting duty cycle of output clock $CLK_{out}$ is 50%, since $CLK_{out}$ spends the same time in the first state than in the second state.

When $D_o$ is one, intermediate clock $CLK_{int}$ pulses each time input clock $CLK_{in}$ pulses unless the output of clock-blocking block 108 is asserted. The output of clock-blocking block 108 may be asserted when the output of divide-by-two block 106 is in a first state, such as high, and the output of modular one-shot divider 104 is pulsing. The duration of a pulse generated by modular one-shot divider 104 may be configured to last for a time equal to a period of a full cycle of input clock $CLK_{in}$. Such configuration may result in clock-blocking block 108 blocking one pulse of input clock $CLK_{in}$ for each full cycle of output $CLK_{out}$, resulting in an output clock having a duty cycle substantially near 50%. For example, if data input $D_{in}$ is a 4-bit number such as binary value low, the 3-bit MSB 100 configures modular one-shot divider 104 to divide intermediate clock $CLK_{int}$ by 4. Since $D_o$ is one, intermediate clock $CLK_{int}$ may be identical to input clock $CLK_{in}$ except that one pulse of $CLK_{in}$ is blocked for each 8 pulses. Divide-by-two block 106 toggles each time modular one-shot divider pulses, resulting in output clock $CLK_{out\ being}$ 5 cycles in a first state, such as high, and 4 cycles in a second state, such as low. Such resulting frequency is 9 times slower than input clock $CLK_{in}$, thus, dividing input clock $CLK_{in}$ by 9, or its binary equivalent 1001. In this case, output clock $CLK_{out}$ may have a duty cycle of about 55.56%.

As can be seen from the previous example, the duty cycle D of output clock $CLK_{out}$ when dividing the input clock by an odd number n may be given by $$D = \frac{n \pm 1}{2n} \quad (1)$$

where n represents the decimal value of an odd number in data input $D_{in}$. As can be seen from Equation 1, when programmable clock divider 100 is configured to divide input clock $CLK_{in}$ by an odd number, the duty cycle D is substantially near 50%. When programmable clock divider 100 is configured to divide input clock $CLK_{in}$ by an even number, the duty cycle D is 50%.

Modular one-shot divider 104 is configured to pulse once for every x times that intermediate clock $CLK_{int}$ pulses, where x is the decimal equivalent of the n-1 MSBs of data input $D_{in}$. The pulse produced by modular one-shot divider 104 may have a duration of time substantially equal to the period of a full cycle of input clock $CLK_{in}$. In other words, if input clock $CLK_{in}$ is running at 5 GHz, thereby having a period of 200 pS, the duration of a pulse produced generated by modular one-shot divider 104 may be 200 pS. In such a case, a pulse of 200 pS of duration may be generated each time intermediate clock $CLK_{int}$ pulses. Modular one-shot divider 104 may be implemented in any way known in the art.

Divide-by-two block 106 is configured to toggle each time modular one-shot divider 104 pulses. Divide-by-two block 106 may be implemented in any way known in the art.

Advantages of various embodiments of the present invention include the production of an output clock with a duty cycle substantially near 50%. For divisions over an even number, the duty cycle of the output clock may be exactly 50%.

Figure 2A:
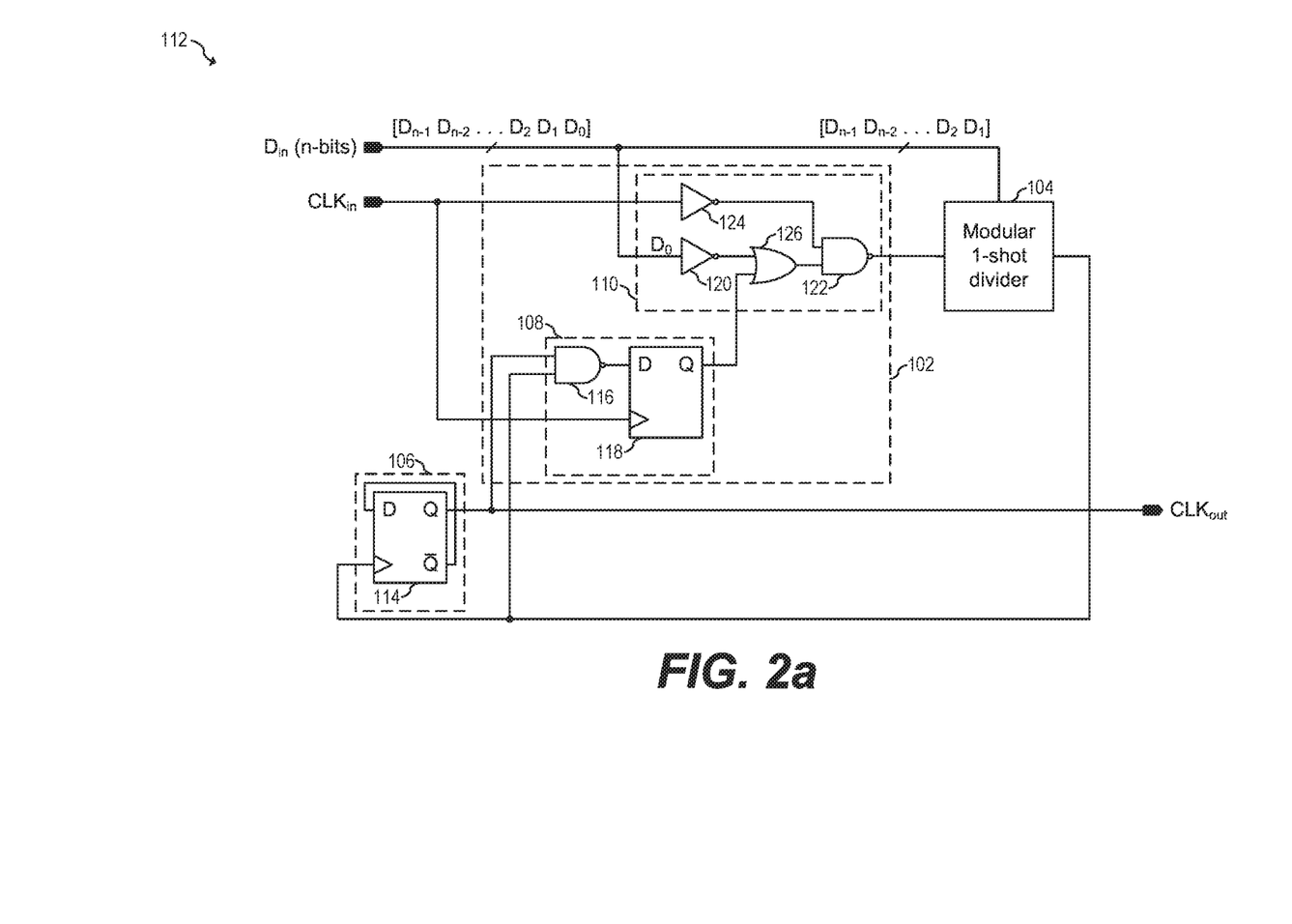
FIG. 2*a* shows a programmable clock divider illustrating particular implementations of various sub-blocks, according to an embodiment of the present invention.

FIG. 2a shows programmable clock divider 112 illustrating particular implementations of various sub-blocks, according to an embodiment of the present invention. Programmable clock divider 112 may operate in a similar manner as programmable clock divider loft Divide-by-two block 106 is configured to toggle each time it is clocked, and may include D-flip-flop 114. D-flip-flop 114 may be configured to latch at a rising edge of its input clock. Alternatively, D-flop-flop 114 may be configured to latch at a falling edge of its input clock.

Clock-blocking block 108 may be implemented with NAND gate 116 and D-flip-flop 118. As can be seen from FIG. 2a, the output of clock-blocking block 108 may be one for each pulse of input clock $CLK_{in}$ unless both inputs of NAND gate 116 are one. An input of NAND gate 116 comes from the output of modular one-shot divider 104, which may be one for the duration of a full clock cycle of input clock $CLK_{in}$, and may be zero for the other x-1 clock cycles, where x is the decimal equivalent of the n-1 MSBs of data input $D_{in}$. Another input of NAND gate 116 comes from output clock $CLK_{out}$, which toggles between one and zero every pulse of modular one-shot divider 104. The output of clock-blocking block 108, therefore, may be zero for a period of time equal to the duration of a full clock cycle of input clock $CLK_{in}$ every x clock cycles. Clock-blocking block 108 may also be implemented in other ways known in the art.

Digital logic block no may include inverters 120 and 124, OR gate 126 and NAND gate 122. As shown in FIG. 2a, when $D_o$ is zero, the output of OR gate 126 is always one, thereby causing input clock $CLK_{in}$ to be buffered to the output of intermediate frequency generator 102. When $D_o$ is one, however, the output of OR gate 126 is the same as the output of clock-blocking block 108. When output of clock-blocking block 108 is one, input clock $CLK_{in}$ is buffered to the output of intermediate frequency generator 102. When the output of OR gate 126 is zero, however, NAND gate 122 has an output of one regardless of the state of input clock $CLK_{in}$. It is said, therefore, that input clock $CLK_{in}$ is blocked when clock-blocking block 108 is zero and $D_o$ is zero.

Advantages of various embodiments of the present invention include that glitches that may be produced by changing data input $D_{in}$ dynamically are not propagated to output clock $CLK_{out}$. Therefore, no additional circuitry may be required to allow for dynamic changing of data input $D_{in}$.

Figure 2B:
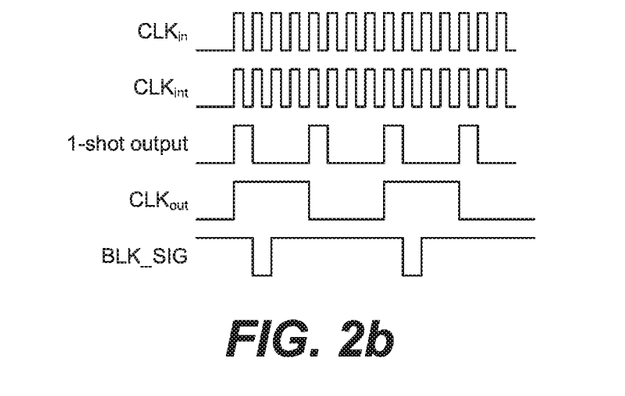
FIGS. 2*b*-2*e* show timing diagrams for various signal of a programmable clock divider, according to an embodiment of the present invention.

FIGS. 2b-2e show timing diagrams for various signal of programmable clock divider 112, according to an embodiment of the present invention. FIG. 2b shows a timing diagram of programmable clock divider 112, configured to divide by 8. In other words, data input $D_{in}$ is configured with a binary value of 1000, where binary value 100 is used to configure modular one-shot divider 104 to divide by 4, and $D_o$ is zero. As shown in FIG. 2b, intermediate clock $CLK_{int}$ may be identical to input clock $CLK_{in}$, thus, ignoring the output of clock-blocking block 108 shown by BLK_SIG. The output of modular one-shot divider 104 produces a pulse with a duration equal to a full clock cycle of input clock $CLK_{in}$ every 4 cycles of intermediate clock $CLK_{int}$, thus, dividing input clock $CLK_{in}$ by 4. Output clock $CLK_{out}$ toggles each time modular one-shot divider 104 pulses, thus, producing a 50% duty cycle clock which is 8 times slower than input clock $CLK_{in}$.

Figure 2C:
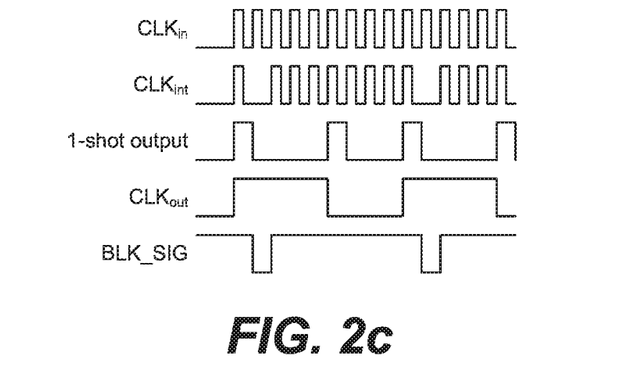

FIG. 2c shows a timing diagram of programmable clock divider 112, configured to divide by 9. In other words, data input $D_{in}$ has the binary value of 1001, where binary value 100 is used to configure modular one-shot divider 104 to divide by 4, and $D_o$ is one. As shown in FIG. 2C, intermediate clock $CLK_{int}$ pulses each time input clock $CLK_{in}$ pulses unless BLK_SIG is asserted (in this case, being low). The output of modular one-shot divider 104 produces a pulse with a duration equal to a full clock cycle of input clock $CLK_{in}$ every 4 cycles of intermediate clock $CLK_{int}$. Since intermediate clock pulses 8 times every 9 pulses of input clock $CLK_{in}$, output clock $CLK_{out}$ produces a signal having 5 cycles in a first state and 4 cycles in a second state, thus, producing a near 50% duty cycle clock, which is 9 times slower than input clock $CLK_{in}$.

Figure 2D:
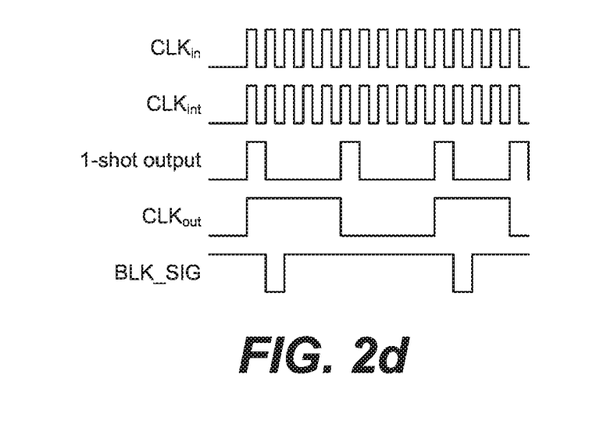

FIG. 2d shows a timing diagram of programmable clock divider 112, configured to divide by 10. In other words, data input $D_{in}$ has the binary value of 1010, where binary value 101 is used to configure modular one-shot divider 104 to divide by 5, and $D_o$ is zero. As shown in FIG. 2d, intermediate clock $CLK_{int}$ may be identical to input clock $CLK_{in}$, thus, ignoring the output of clock-blocking block 108 shown by BLK_SIG. The output of modular one-shot divider 104 produces a pulse with a duration equal to a full clock cycle of input clock $CLK_{in}$ every 5 cycles of intermediate clock $CLK_{int}$, thus, dividing input clock $CLK_{in}$ by 5. Output clock $CLK_{out}$ toggles each time modular one-shot divider 104 pulses, thus, producing a 50% duty cycle clock which is 10 times slower than input clock $CLK_{in}$.

Figure 2E:
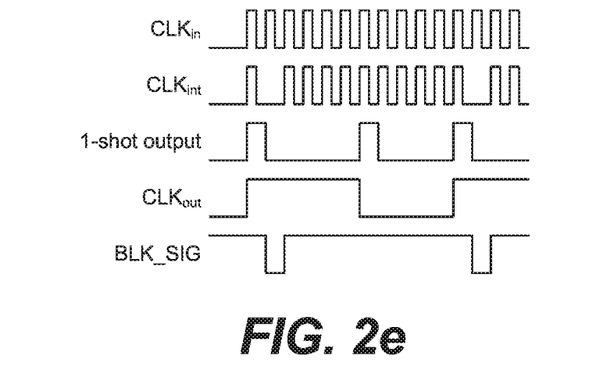

FIG. 2e shows a timing diagram of programmable clock divider 112, configured to divide by 11. In other words, data input $D_{in}$ has the binary value of 1011, where binary value 101 is used to configure modular one-shot divider 104 to divide by 5, and $D_o$ is one. As shown in FIG. 2e, intermediate clock $CLK_{int}$ pulses each time input clock $CLK_{in}$ pulses unless BLK_SIG is asserted (in this case, being low). The output of modular one-shot divider 104 produces a pulse with a duration equal to a full clock cycle of input clock $CLK_{in}$ every 5 cycles of intermediate clock $CLK_{int}$. Since intermediate clock pulses 9 times every 10 pulses of input clock $CLK_{in}$, output clock $CLK_{out}$ produces a signal that having 6 cycles in a first state and 5 cycles in a second state, thus, producing a near 50% duty cycle clock which is 11 times slower than input clock $CLK_{in}$.

Figure 3:
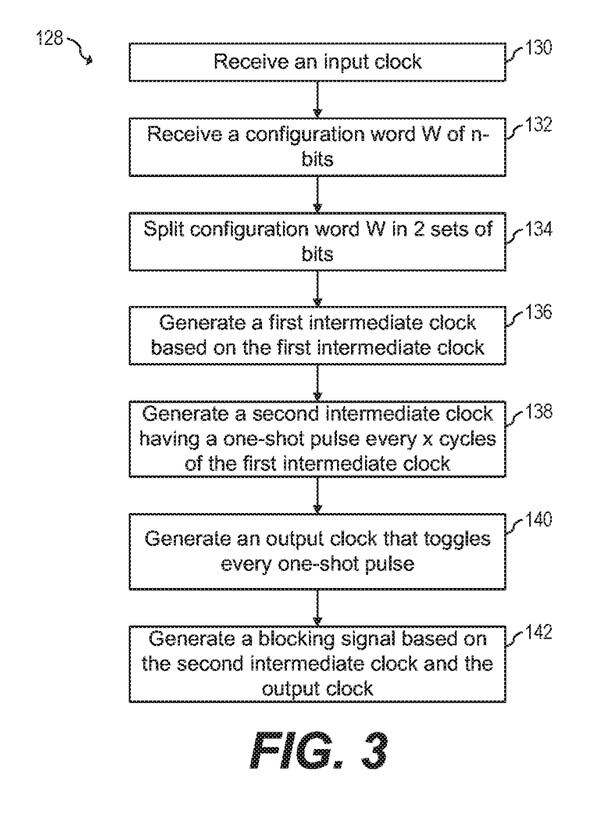
FIG. 3 illustrates a flow chart of an embodiment method for generating an output clock based on dividing an input clock by a programmable integer value.

FIG. 3 illustrates a flow chart of embodiment method 128 for generating an output clock based on dividing an input clock by a programmable integer value. Method 128 may receive a configuration word W having n bits and may generate a near 50% duty cycle output clock based on dividing an input clock by the decimal equivalent of configuration word W. Specifically, method 128 may split configuration word W into 2 sets: a first set containing the n-1 MSBs of configuration word W, and a set containing the LSB of configuration word W. Method 128, then, may use the first set to divide an intermediate clock $CLK_{int}$ by the decimal equivalent of the value of the first set, and may use the state of the LSB to block a single pulse of the input clock every full division cycle. The intermediate clock, therefore, may be identical to the input clock when the LSB is zero, and may block a clock cycle of the input clock every full division cycle when the LSB is one. Method 128 may be implemented with programmable clock divider 100 and programmable clock divider 112. Alternatively, method 128 may be implemented with other circuit architectures and in other ways known in the art. The discussion that follows assumes that programmable clock divider 112, as shown in FIG. 2a, implements method 128 for generating an output clock based on dividing an input clock by a programmable integer value.

Step 130 receives input clock $CLK_{in}$. Step 132 receives a configuration word, such as data input $D_{in}$, having n bits. Step 134 splits configuration word W into two sets of bits, a first set containing n-1 MSBs of configuration word W, and a second set containing the LSB of configuration word W. Step 136 generates a first intermediate clock $CLK_{int}$ based on input clock $CLK_{in}$. Generating first intermediate clock $CLK_{int}$ is also based on the state of the LSB of configuration word W and the state of a blocking signal. When the LSB of configuration word W is zero, first intermediate clock $CLK_{int}$ may be identical to input clock $CLK_{in}$. When the LSB of configuration word W is one, first intermediate clock $CLK_{int}$ may pulse each time input clock $CLK_{in}$ pulse unless the blocking signal is asserted.

Step 132 generates a second intermediate clock based on the first intermediate clock $CLK_{int}$ and on the first set of bits of configuration word W. Specifically, step 132 generates a one-shot pulse having a first duration every x cycles of the first intermediate clock $CLK_{int}$, where x is the decimal equivalent of the first set of bits of configuration word W. Step 140 generates an output clock that toggles every one-shot pulse, thereby dividing the second intermediate clock frequency by two and producing an output clock with near 50% duty cycle. Such duty cycle may be given by Equation 1. Step 142 generates the blocking signal based on the second intermediate clock and the output clock. Specifically, step 142 may assert the blocking signal during the one-shot pulse when the output clock is at a first state.

Figure 4:
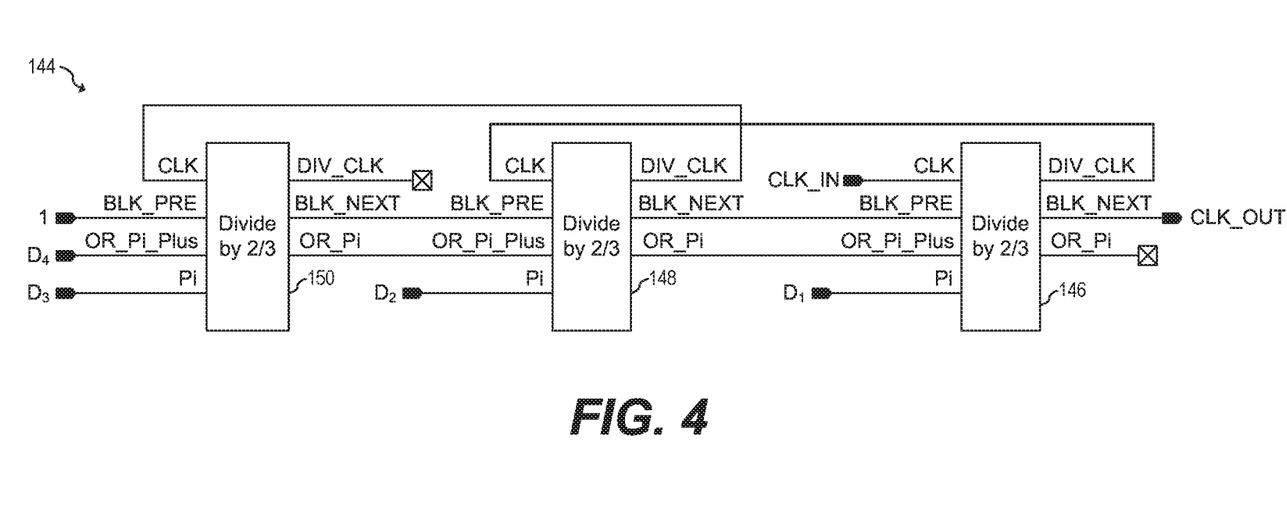
FIG. 4 shows a modular one-shot divider, according to an embodiment of the present invention.

FIG. 4 shows modular one-shot divider 144, according to an embodiment of the present invention. Modular one-shot divider 144 includes three divide-by-two-three dividers 146, 148, and 150 and may be configured to receive a 4-bit configuration word $W_4$, where $D_4$ is the MSB and $D_1$ is the LSB. As shown in FIG. 4, the three divide-by-two-three dividers 146, 148, and 150 are connected in a feedback scheme that produces output clock CLK_OUT producing a one-shot pulse every x cycles of input clock CLK_IN, where x is the decimal equivalent of the configuration word $W_4$.

Divide-by-two-three divider 146 receives input clock CLK_IN and produces output DIV_CLK, which may be CLK_IN divided by either two or three depending on whether $D_1$ is zero or one respectively. Divide-by-two-three divider 146 also produces output BLK_NEXT, which is also output clock CLK_OUT, and is based on signals DIV_CLK, BLK_PRE and OR_Pi_Plus of divide-by-two-three divider 146.

Similarly, divide-by-two-three divider 148 receives an input clock coming from the output DIV_CLK of divide-by-two-three divider 146, and may further divide such clock, producing on its output DIV_CLK a clock signal being its input CLK divided by either two or three depending on whether $D_2$ is zero or one. Divide-by-two-three divider 148 also produces an output BLK_NEXT, which is connected to BLK_PRE terminal of divide-by-two-three divider 146, based on signals DIV_CLK, BLK_PRE and OR_Pi_Plus of divide-by-two-three divider 148. Divide-by-two-three divider 148 further produces OR_Pi output based on its Pi and Or_Pi_Plus inputs. The OR_Pi output of divide-by-two-three divider 148 may be connected to the OR_Pi_Plus input of divide-by-two-three divider 146.

Divide-by-two-three divider 150 receives an input clock coming from the output DIV_CLK of divide-by-two-three divider 148. Divide-by-two-three divider 150 produces an output BLK_NEXT, which is connected to BLK_PRE terminal of divide-by-two-three divider 148, based on signals $D_4$ and $D_3$. Divide-by-two-three divider 150 also produces OR_Pi output based on signals $D_4$ and $D_3$. The OR_Pi output of divide-by-two-three divider 150 may be connected to the OR_Pi_Plus input of divide-by-two-three divider 148.

Modular one-shot divider 144 may be implemented with three divide-by-two-three dividers identical to each other. Other implementations may be possible.

Figure 5:
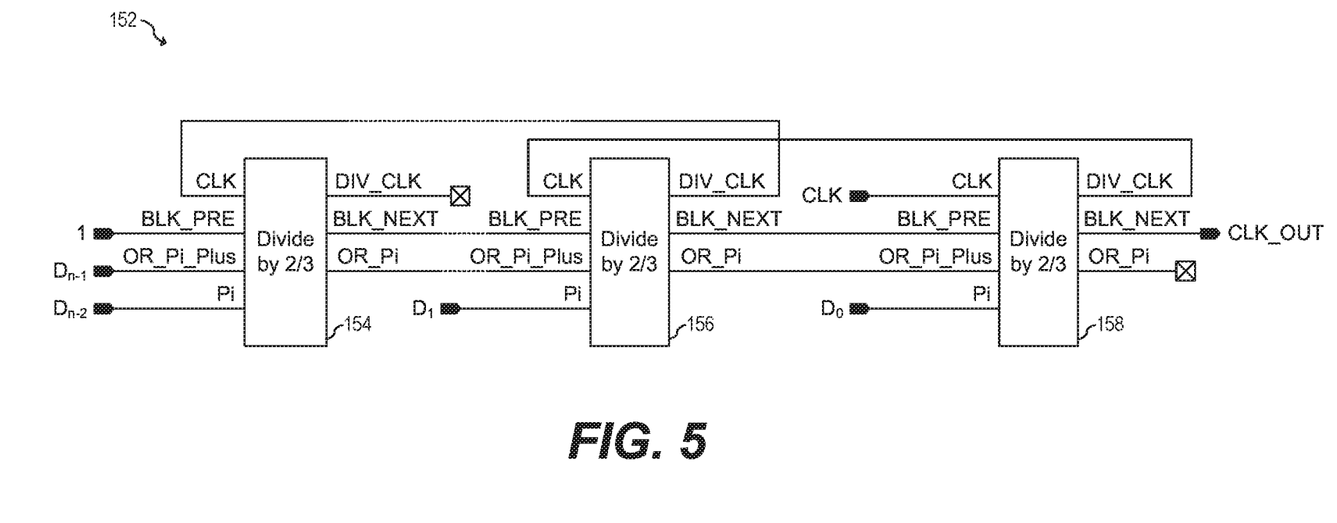
FIG. 5 shows a possible implementation modular a one-shot divider, according to an embodiment of the present invention.

Modular one-shot divider 144 may be used as a 4-bit programmable clock divider. The architecture, however, may be extended by adding or removing divide-by-two-three blocks. FIG. 5 shows a possible implementation modular one-shot divider 152, according to an embodiment of the present invention. Modular one-shot divider 152 may be programmable by n bits, and may include n-i divide-by-two-three blocks.

Figure 6:
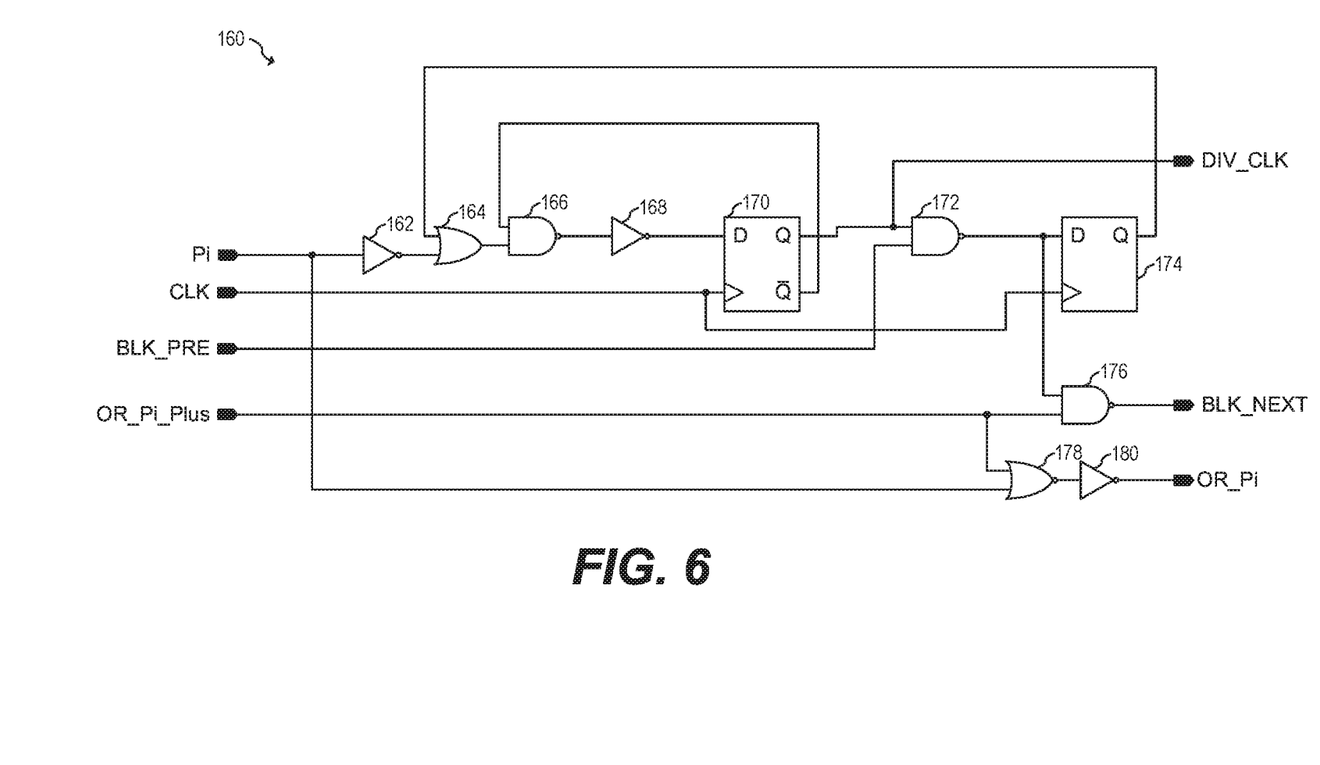
FIG. 6 shows a possible implementation of divide-by-two-three block 160, according to an embodiment of the present invention.

FIG. 6 shows a possible implementation of divide-by-two-three block 160, according to an embodiment of the present invention. Divide-by-two-three block 160 is configured to generate divided clock DIV_CLK two or three times slower than input clock CLK depending on the state of input Pi. Divide-by-two-three block 160 may include inverters 162, 168 and 180, OR gate 164, NOR gate 178, NAND gates 166, 172, and 176 and D-flip-flops 170 and 172.

During normal operation, when input Pi is zero, the output of OR gate 164 is always one, causing D-flip-flop 170 to toggle each clock cycle of input clock CLK. When input Pi is one, if BLK_PRE is zero, the output of OR gate 164 is always one, therefore causing D-flip-flop 170 to toggle each clock cycle of input clock CLK. However, when input Pi is one, and BLK_PRE is one, the output of OR gate 164 is zero once every three cycle, thus, producing a clock frequency at DIV CLK that is three times slower than input clock CLK.

Output OR_Pi is based of input Pi and input OR_Pi_Plus. OR_pi may be one if either PI or OR_Pi_Plus is one. Otherwise, OR_Pi may be zero. Output BLK_NEXT produces an output based on input OR_Pi_Plus and input BLK_PRE. When BLK_PRE is zero, the output of NAND gate 172 is one, thus, causing output BLK_NEX to be the inverted version of input OR_Pi_Plus. When BLK_PRE is one, the output of NAND gate 172 will depend only on the state of D-flip-flop 172, casing output BLK_NEXT to alternate between the inverted version of OR_Pi_Plus and one.

As shown in FIGS. 4 and 5, divide-by-two-three block 160 as shown in FIG. 6 may be used in modular one-shot divider designs. Even though a particular implementation of divide-by-two-three block 160 is shown in FIG. 6, other implementations may be possible, such as, for example, optimizing the design using digital techniques known in the art.

One general aspect includes a circuit including: an input clock terminal; an output clock terminal; a first input data terminal; a set of input data terminals having a number of terminals, where the number of terminals is greater or equal to one, the first input data terminal being excluded from the set of input data terminals; a divide-by-two block coupled to the output clock terminal; a modular one-shot clock divider coupled between the input clock terminal and the divide-by-two block, the modular one-shot clock divider further coupled to the set of input data terminals; and an intermediate clock generation block coupled between the input clock terminal and the modular one-shot clock divider, the intermediate clock generation block including a first digital logic block coupled between the input clock terminal and the modular one-shot clock divider, the first digital logic block further coupled to the first input data terminal, and a clock-blocking block coupled between the divide-by-two block and the first digital logic block.

Implementations may include one or more of the following features. The circuit where the divide-by-two block includes a D-flip-flop. The circuit where the input clock terminal is configured to receive a clock signal in a range of 1 to 10 GHz. The circuit where the first digital logic block is configured to generated a first intermediate clock, the modular one-shot clock divider includes a first divide-by-two-three block, the first divide-by-two-three block is configured to receive the first intermediate clock, and the divide-by-two block is configured to generate a clock signal with a duty cycle of substantially 50%. The circuit where the first divide-by-two-three block includes at most two flip-flops configured to receive the first intermediate clock. The circuit where the modular one-shot clock divider further includes a second divide-by-two-three block coupled to the first divide-by-two-three block. The circuit where the first divide-by-two-three block and the second divide-by-two-three block are identical. The circuit where the clock-blocking block includes a flip-flop.

Another general aspect includes a method including: receiving an input clock having a plurality of clock pulses; receiving a configuration word having a number of bits including a least significant bit and a plurality of most-significant-bits, where a number of most-significant-bits of the configuration word has a first decimal equivalent number; generating a first intermediate clock based on the input clock, the first intermediate clock having a plurality of clock pulses; generating a second intermediate clock having a one-shot pulse every first decimal equivalent number of first intermediate clock pulses, where the one-shot pulse includes a transition from a first state to a second state and a transition from the second state to the first state; and generating an output clock that toggles between a first state and a second state every one-shot pulse, where when a least-significant-bit of the configuration word has a first logical value, generating the first intermediate clock includes generating a clock pulse each time the input clock pulses, and when the least-significant-bit of the configuration word has a second logical value different than the first logical value, generating the first intermediate clock includes generating a clock pulse each time the second intermediate clock is in the second state and the input clock pulses and the second intermediate clock is in the first state, the output clock is in the first state and the input clock pulses.

Implementations may include one or more of the following features. The method where a duration of the first state of the output clock and the duration of the second state of the output clock is substantially equal. The method where the one-shot pulse is in the second state for a duration substantially equal to a duration of a full cycle of the input clock. The method where the first state of the second intermediate clock is one and the first state of the output clock is zero. The method where the number of bits of the configuration word is 5. The method where the input clock runs at a frequency higher than 1 GHz.

Yet another general aspect includes a circuit including an intermediate clock generator block configured to generate a first intermediate clock based on an input clock, a modular one-shot divider configured to receive a first number of bits minus one most-significant-bits of a configuration word, the configuration word having the first number of bits, where the first number of bits minus one most-significant-bits of the configuration word have a first decimal equivalent number, the modular one-shot divider configured to generate a second intermediate clock based on the first intermediate clock, where the generating the second intermediate clock includes generating a one-shot pulse every first decimal equivalent number of first intermediate clock pulses, where the one-shot pulse includes a transition from a first state to a second state and a transition from the second state to the first state; and a divide-by-two block configured to generate an output clock that toggles between a first state and a second state every one-shot pulse, where when a least-significant-bit of the configuration word is zero, the intermediate clock generator block generates a clock pulse each time the input clock pulses, and when the least-significant-bit of the configuration word is one, the intermediate clock generator block generates a clock pulse each time the second intermediate clock is in the second state and the input clock pulses and the second intermediate clock is in the first state, the output clock is in the first state and the input clock pulses.

Implementations may include one or more of the following features. The circuit where duration of the first state of the output clock and the duration of the second state of the output clock is substantially equal. The circuit where the modular one-shot divider includes a first divide-by-two-three block, and the first divide-by-two-three block is configured to receive the first intermediate clock. The circuit where the modular one-shot divider further includes a second divide-by-two-three block coupled to the first divide-by-two-three block, and a third divide-by-two-three block coupled to the second divide-by-two-three block and further coupled to the first divide-by-two-three block, the first, second and third divide-by-two-three blocks being identical to each other. The circuit where the first divide-by-two-three block is configured to generated the second intermediate clock. The circuit where the intermediate clock generator block includes a first digital logic block configured to receive the input clock, generate the first intermediate clock, and receive the least-significant-bit of the configuration word; and a clock-blocking block configured to receive the output clock and the second intermediate clock and further configured to generate a blocking signal based on the output clock and the second intermediate clock. The circuit where the input clock operates at a frequency lower than 1 GHz.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
an input clock terminal;
an output clock terminal;
a first input data terminal;
a set of input data terminals having a number of terminals, wherein the number of terminals is greater or equal to one, the first input data terminal being excluded from the set of input data terminals;
a divide-by-two block coupled to the output clock terminal;

a modular one-shot clock divider coupled between the input clock terminal and the divide-by-two block, the modular one-shot clock divider further coupled to the set of input data terminals; and an intermediate clock generation block coupled between the input clock terminal and the modular one-shot clock divider, the intermediate clock generation block comprising
a first digital logic block coupled between the input clock terminal and the modular one-shot clock divider, the first digital logic block further coupled to the first input data terminal, and
a clock-blocking block coupled between the divide-by-two block and the first digital logic block.

2. The circuit of claim 1, wherein the divide-by-two block comprises a D-flip-flop.

3. The circuit of claim 1, wherein the input clock terminal is configured to receive a clock signal in a range of 1 to 10 GHz.

4. The circuit of claim 1, wherein
the first digital logic block is configured to generated a first intermediate clock,
the modular one-shot clock divider comprises a first divide-by-two-three block,
the first divide-by-two-three block is configured to receive the first intermediate clock, and
the divide-by-two block is configured to generate a clock signal with a duty cycle of substantially 50%.

5. The circuit of claim 4, wherein the first divide-by-two-three block comprises at most two flip-flops configured to receive the first intermediate clock.

6. The circuit of claim 4, wherein the modular one-shot clock divider further comprises a second divide-by-two-three block coupled to the first divide-by-two-three block.

7. The circuit of claim 6, wherein the first divide-by-two-three block and the second divide-by-two-three block are identical.

8. The circuit of claim 1, wherein the clock-blocking block comprises a flip-flop.

9. A method comprising:
receiving an input clock having a plurality of clock pulses;
receiving a configuration word having a number of bits including a least significant bit and a plurality of most-significant-bits, wherein a number of most-significant-bits of the configuration word has a first decimal equivalent number;
generating a first intermediate clock based on the input clock, the first intermediate clock having a plurality of clock pulses;
generating a second intermediate clock having a one-shot pulse every first decimal equivalent number of first intermediate clock pulses, wherein the one-shot pulse comprises a transition from a first state to a second state and a transition from the second state to the first state; and
generating an output clock that toggles between a first state and a second state every one-shot pulse, wherein
when a least-significant-bit of the configuration word has a first logical value, generating the first intermediate clock comprises generating a clock pulse each time the input clock pulses, and
when the least-significant-bit of the configuration word has a second logical value different than the first logical value, generating the first intermediate clock comprises generating a clock pulse each time
the second intermediate clock is in the second state and the input clock pulses and
the second intermediate clock is in the first state, the output clock is in the first state and the input clock pulses.

10. The method of claim 9, wherein a duration of the first state of the output clock and the duration of the second state of the output clock is substantially equal.

11. The method of claim 9, wherein the one-shot pulse is in the second state for a duration substantially equal to a duration of a full cycle of the input clock.

12. The method of claim 9, wherein the first state of the second intermediate clock is one and the first state of the output clock is zero.

13. The method of claim 9, wherein the number of bits of the configuration word is 5.

14. The method of claim 9, wherein the input clock runs at a frequency higher than 1 GHz.

15. A circuit comprising:
an intermediate clock generator block configured to generate a first intermediate clock based on an input clock,
a modular one-shot divider configured to receive a first number of bits minus one most-significant-bits of a configuration word, the configuration word having the first number of bits, wherein the first number of bits minus one most-significant-bits of the configuration word have a first decimal equivalent number, the modular one-shot divider configured to generate a second intermediate clock based on the first intermediate clock, wherein generating the second intermediate clock comprises generating a one-shot pulse every first decimal equivalent number of first intermediate clock pulses, wherein the one-shot pulse comprises a transition from a first state to a second state and a transition from the second state to the first state; and
a divide-by-two block configured to generate an output clock that toggles between a first state and a second state every one-shot pulse, wherein
when a least-significant-bit of the configuration word is zero, the intermediate clock generator block generates a clock pulse each time the input clock pulses, and
when the least-significant-bit of the configuration word is one, the intermediate clock generator block generates a clock pulse each time
the second intermediate clock is in the second state and the input clock pulses and
the second intermediate clock is in the first state, the output clock is in the first state and the input clock pulses.

16. The circuit of claim 15, wherein duration of the first state of the output clock and the duration of the second state of the output clock is substantially equal.

17. The circuit of claim 15, wherein
the modular one-shot divider comprises a first divide-by-two-three block, and
the first divide-by-two-three block is configured to receive the first intermediate clock.

18. The circuit of claim 17, wherein the modular one-shot divider further comprises
a second divide-by-two-three block coupled to the first divide-by-two-three block, and
a third divide-by-two-three block coupled to the second divide-by-two-three block and further coupled to the first divide-by-two-three block, the first, second and third divide-by-two-three blocks being identical to each other.

19. The circuit of claim 17, wherein the first divide-by-two-three block is configured to generated the second intermediate clock.

20. The circuit of claim 15, wherein the intermediate clock generator block comprises
- a first digital logic block configured to
  - receive the input clock,
  - generate the first intermediate clock, and
  - receive the least-significant-bit of the configuration word; and
- a clock-blocking block configured to receive the output clock and the second intermediate clock and further configured to generate a blocking signal based on the output clock and the second intermediate clock.

21. The circuit of claim 15, wherein the input clock operates at a frequency lower than 1 GHz.

* * * * *